(12) United States Patent
Koppert

(10) Patent No.: US 10,185,230 B2
(45) Date of Patent: Jan. 22, 2019

(54) MEASUREMENT APPARATUS AND METHOD

(71) Applicant: ASML Netherlands B.V., Veldhoven (NL)

(72) Inventor: Willem Jakobus Cornelis Koppert, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/562,729

(22) PCT Filed: Mar. 10, 2016

(86) PCT No.: PCT/EP2016/055067
§ 371 (c)(1),
(2) Date: Sep. 28, 2017

(87) PCT Pub. No.: WO2016/177493
PCT Pub. Date: Nov. 10, 2016

(65) Prior Publication Data
US 2018/0081279 A1    Mar. 22, 2018

(30) Foreign Application Priority Data
May 7, 2015   (EP) ..................................... 15166773

(51) Int. Cl.
*G03F 7/09*       (2006.01)
*G03F 7/20*       (2006.01)
(Continued)

(52) U.S. Cl.
CPC ........... *G03F 7/7085* (2013.01); *G01R 1/071* (2013.01); *G03F 7/70008* (2013.01);
(Continued)

(58) Field of Classification Search
CPC ........ G01J 1/429; G01J 1/0407; G01J 1/0418; G01J 1/26; G01J 1/4257; G01J 1/58;
(Continued)

(56) References Cited

U.S. PATENT DOCUMENTS 4,922,186 A    5/1990  Tsuchiya et al.
5,113,131 A    5/1992  Cooper et al.
(Continued)

FOREIGN PATENT DOCUMENTS

EP    0541139 A2        5/1993
JP    2002-270399 A     9/2002
WO    WO 2014/202585 A2  12/2014

OTHER PUBLICATIONS

International Search Report and Written Opinion of the International Searching Authority directed to related International Patent Application No. PCT/EP2016/055067, dated Jul. 11, 2016; 11 pages.
(Continued)

*Primary Examiner* — Michael P Stafira
(74) *Attorney, Agent, or Firm* — Sterne, Kessler, Goldstein & Fox P.L.L.C.

(57) ABSTRACT

A measurement apparatus for measuring at least one property of an electron bunch or other group of charged particles travelling through a cavity (310), comprises a plurality of electrodes (302-308) arranged around the cavity, a plurality of optical sensors (322-328), wherein the plurality of electrodes are configured to provide signals to the optical sensors thereby to modulate at least one optical property of the optical sensors. The apparatus further comprises at least one laser source (330) for providing a laser beam comprising a series of laser pulses to the plurality of optical sensors to obtain measurements representative of said at least one optical property of the optical sensors, and a processing resource (320) configured to process at least a first measure-
(Continued)

ment signal from a first one of the optical sensors and a second measurement signal from a second one of the optical sensors, thereby to determine at least one property of the electron bunch or other group of charged particles, wherein the at least one property comprises charge and/or lateral position.

24 Claims, 6 Drawing Sheets

(51) Int. Cl.
  *G01R 1/07* (2006.01)
  *H01S 3/09* (2006.01)
  *H01S 3/00* (2006.01)
(52) U.S. Cl.
  CPC ........ *G03F 7/70025* (2013.01); *H01S 3/0014* (2013.01); *H01S 3/0903* (2013.01); *G03F 7/09* (2013.01)
(58) Field of Classification Search
  CPC ........ G02B 1/06; G02B 26/023; G02B 5/205; G02B 27/00; G02B 27/4233; G02B 27/44; G02B 6/1226; G02B 27/0025; G02B 27/0938; G02B 27/10; G02B 27/1086; G02B 27/12; G02B 27/14; G02B 27/142; G02B 27/146; G02B 27/4272; G02B 5/0221; G02B 5/0268; G02B 5/0284; G02B 5/1814; G02B 5/1823; G02B 5/1838; G02B 5/1861; G01N 2021/95676; G01N 21/3581
  See application file for complete search history.

(56) References Cited

U.S. PATENT DOCUMENTS

| 2008/0116389 A1 | 5/2008 | Hacker et al. |
| 2012/0185208 A1 | 7/2012 | Baricevic et al. |
| 2015/0076350 A1 | 3/2015 | Plettner et al. |
| 2017/0237225 A1* | 8/2017 | Nikipelov ............ H01S 3/0903 372/2 |
| 2018/0081279 A1* | 3/2018 | Koppert ................ G01R 1/071 |

OTHER PUBLICATIONS

Angelovski et al., "High Bandwidth Pickup Design for Bunch Arrival-time Monitors for Free-Electron Laser," Physical Review Special Topics—Accelerators and Beams 15, 2012; pp. 1-7.

Bock et al., "Recent Developments of the Bunch Arrival Time Monitor with Femtosecond Resolution at Flash," Proceedings of IPAC—Beam Instrumentation & Feedback, May 2010; 27 pages.

Crisp et al., "Tevatron Resistive Wall Current Monitor," Accelerator Physics and Technology at the Tevatron Collider Run II, 2011; 10 pages.

Souda et al., "COD correction for laser cooling at S-LSR," Nuclear Instruments and Methods in Physics Research A, vol. 597, 2008; pp. 160-165.

Stadler et al., "Beam Test Results of Undulator Cavity Bpm Electronics for The European XFEL," Conference Paper, 2014; 5 pages.

* cited by examiner

MEASUREMENT APPARATUS AND METHOD

CROSS-REFERENCE TO RELATED APPLICATIONS

This application claims priority of EP 15166773.0 which was filed on May 7, 2015 and which is incorporated herein in its entirety by reference.

FIELD

The present invention relates to an apparatus and method for measuring one or more properties of electron bunches or other groups of charged particles. The electron bunches may be electron bunches within a free electron laser (FEL) radiation source, for example an FEL radiation source configured to produce radiation having a wavelength in a range 4 nm to 25 nm. The radiation source may, for example, be configured to provide radiation to a lithographic apparatus for projecting a pattern from a patterning device onto a substrate.

BACKGROUND

It is known to use free electron laser (FEL) radiation sources to produce radiation of a desired wavelength, in which an electron beam comprising a periodic sequence of electron bunches is passed through an undulator to generate the radiation. Such sources can be used to produce radiation in a range 4 nm to 25 nm, for example extreme ultra-violet (EUV) radiation, or at other desired wavelengths.

In known FEL radiation sources, ions are produced from residual gas in the electron beam through collisional ionization.

Known FEL sources include LINACs for accelerating (and decelerating) electron bunches before (and after) they pass through the undulator. Energy recovery LINACs can be used, which are usually designed to operate with a balanced cavity load close to zero (e.g. currents in accelerating and decelerating beams match, and energy extracted and deposited upon acceleration and deceleration almost match).

The sequence of electron bunches, which may be referred to as an electron bunch train, may comprise a sequence of electron bunches spaced apart in time, and having different energies and being at different stages of the acceleration and deceleration cycle. It is important that all bunches are precisely aligned in the LINAC or LINACs, both in a lateral direction (e.g. lateral position in a plane perpendicular to the direction of propagation) and longitudinal direction (e.g. separation between successive bunches in time or distance in a direction of propagation of the bunches).

Precise alignment of the bunches can be important to ensure that the electric field integrated over the path length is constant/stable for all bunch energy thereby to assure a well-defined energy of the generated radiation. A gradient in electron energy may be applied over the bunch, such that the electrons in front of the bunch have higher energy than the electrons at the end of the bunch, in view of the eventual bunch compression that may be performed using magnets, to ensure that the integrated field per electron for a given position in the bunch is constant/stable. Precise alignment of the bunches is also important as any deviation of the bunches from the centre of the LINAC will result in a kick due to a gradient in the magnetic field. Both effects may have a large impact on the propagation of the bunches and consequently the yield and stability of the generated radiation.

Beam position monitors are known, which can be used to determine lateral position of an electron beam or electron bunch sequence, or any other suitable charged particle beam. A known beam position monitor is based on capacitive pickup of the coulomb field of the traversing beam. Four electrodes can be spaced with an angular separation of 90° around the beam path. For each quadrant, an electrode picks up a signal. From the signals the 2-D lateral position of the beam can be reconstructed based on the charge induced on the electrode. The charge on the electrodes is read using read-out electronics. Since the falling time following performance of a measurement is slow and since reflections on the electrodes disturb the signal the difference in position between two adjacent bunches can be difficult or impossible to measure using such a known beam position monitor. Other beam position monitors are also known which use different types of electrodes and electrode geometries, for example with electrodes positioned with different angular separations.

Bunch arrival time monitors are also known. A known bunch arrival time monitor measures the time of arrival of a bunch with respect to, for instance, a master clock. In such a known monitor, dedicated electrodes may be coupled to electro-optic modulator crystals rather than the read-out electronics used for beam position monitors. Four such electrodes can be spaced with an angular separation of 90° around the beam path, with each pair of opposing electrodes being coupled to a respective electro-optic modulator crystal. Thus, two electro-optic modulator crystals are used to obtain measurements from the four electrodes, with each pair opposing electrodes being coupled to a respective one of the electro-optic crystals. The electric field measured by an electrode is a function of the proximity of the bunch to the electrode, although in many arrangements the signals of two opposing electrodes are combined to eliminate position dependence. The monitor may be configured to provide a fine readout channel with high bandwidth limited range and a coarse channel with lower bandwidth and large measurement range.

The arrival time of a bunch is measured using the electro-optic modulator crystals, which change their optical properties when an electric field is applied. The changing electric field changes the properties of the crystal. A pulsed femtosecond laser, which may in some cases be guided by an optical fibre, probes the crystals. The timing of the optical reference pulse is adjusted such that the pulses sample the pick-up signal at its zero crossing. At this operation point the inherent dependence of the arrival time measurement on the bunch charge is reduced. All subsequent electron bunches whose time of arrival deviates from this reference point cause an amplitude modulation of the sampling laser pulses. Other bunch arrival time monitors with different electrode types and arrangements, or including other components such as R.F. cavities are also known.

The position of bunches in FEL radiation sources can be precisely adjusted using bending magnets and combiners/spreaders. However, accurate adjustments would require accurate diagnostics to see whether the bunch train in the LINACs is aligned correctly. Typical known beam position monitors cannot distinguish between different energies and may integrate measurements over all bunches It is an aim of the present invention to provide an improved or at least alternative apparatus and method for measuring at least one property of an electron bunch or other charged particle bunch, for example in a radiation source.

SUMMARY

According to an aspect of the invention, there is provided a measurement apparatus for measuring at least one property of an electron bunch or other group of charged particles travelling through a cavity, comprising: a plurality of electrodes arranged around the cavity; a plurality of optical sensors, wherein the plurality of electrodes are configured to provide signals to the optical sensors thereby to modulate at least one optical property of the optical sensors; at least one laser source for providing a laser beam comprising a series of laser pulses to the plurality of optical sensors to obtain measurements representative of said at least one optical property of the optical sensors; and a processing resource configured to process at least a first measurement signal from a first one of the optical sensors and a second measurement signal from a second one of the optical sensors, thereby to determine at least one property of the electron bunch or other group of charged particles, wherein the at least one property comprises: charge and/or lateral position.

Thus, measurements charge and/or lateral position of individual electron bunches within a bunch train, or other individual groups of charged particles, may be obtained. That can be particularly useful in the context of a LINAC of a free electron radiation source in which closely spaced electron bunches of different energies make up an electron bunch train that passes through the LINAC, and in which variations in charge and/or position of the bunches of different energies can ultimately have a significant effect on the radiation produced by the radiation source.

The lateral position may comprise position in a plane perpendicular to a longitudinal direction of the cavity and/or perpendicular to a desired path of the electron bunch. Each sensor may comprise at least one sensing component, for example, a suitable electro-optic modulator crystal and at least one measuring component, for example a diode or other electronic component or circuitry, to provide a measurement signal that is dependent on said at least one optical property of the at least one sensing component.

The plurality of optical sensors may comprise a plurality of electro-optic modulators, the first one of the optical sensors may comprise a first one of the electro-optic modulators, and the second one of the optical sensors may comprise a second one of the electro-optic modulators. The plurality of optical sensors may comprise a plurality of electro-optic crystals.

The at least one property may comprise lateral position, and the processing of the first measurement signal, which is from the first one of the optical sensors, and the second measurement signal, which is from the second one of the optical sensors, may comprise determining a difference between the first measurement signal and the second measurement signal.

The plurality of optical sensors may comprise at least one further optical sensor, and the processing resource may be further configured to process at least one further measurement signal from said at least one further optical sensor, to determine said at least one property.

The processing resource may be configured to process a third measurement signal from a third one of the optical sensors and a fourth measurement signal from a fourth one of the optical sensors.

The processing of the first measurement signal and the second measurement signal may be to determine a position of the electron bunch or other group of charged particles in a first lateral direction, and the processing of the third measurement signal and the fourth measurement signal may be to determine a position of the electron bunch or other group of charged particles in a second lateral direction.

The second direction may be substantially orthogonal to the first direction. The first direction and the second direction may be in a plane substantially orthogonal to the path of the electron bunch or other group of charged particles.

The at least one property of the electron bunch or other group of charged particles may comprise charge of the electron bunch or other group of charged particles, and the processing resource may be configured to determine the charge in dependence on a sum of measurement signals.

The sum of measurement signals may comprise or be representative of a sum of at least the first and second measurement signals.

The sum of measurement signals may comprise or be representative of a sum of at least the first, second, third and fourth measurement signals.

The first optical sensor from which the first measurement signal is obtained may receive signals from a first one of the electrodes, and the second optical sensor from which the second measurement signal is obtained may receive signals from a second one of the electrodes.

The first one of the electrodes may be substantially diametrically opposed to the second one of the electrodes.

The third optical sensor from which the third measurement signal is obtained may receive signals from a third one of the electrodes, and the fourth optical sensor from which the fourth measurement signal is obtained may receive signals from a fourth one of the electrodes The third one of the electrodes may be substantially diametrically opposed to the fourth one of the electrodes with respect to the path of the electron bunch or other group of charged particles.

The apparatus may comprise a propagation cavity. The first one of the electrodes may be arranged at one side of the propagation cavity and the second one of the electrodes may be arranged at the opposite side of the propagation cavity. The first one of the electrodes may be arranged at an angular separation of approximately 180 degrees from the second one of the electrodes. The third one of the electrodes may be arranged at an angular separation of approximately 180 degrees from the fourth one of the electrodes. The first, second, third and fourth electrodes may be arranged to have angular separations of approximately 90 degrees. The apparatus may comprise further electrodes in addition to the first, second, third and fourth electrodes. Angular separations other than approximately 90 degrees or approximately 180 degrees may be used. Signals from the further electrodes may, for example, be used as a check or to obtain improved signal-to-noise ratio or to obtain further information concerning the electron bunch or other group of charged particles.

The laser source may be configured to provide the series of laser pulses such that the first measurement signal comprises a local maximum signal for the first one of the optical sensors and the second measurement signal comprises a local maximum signal for the second one of the optical sensors.

The optical sensors and the electrodes may be arranged such that in operation each one of the optical sensors receives signals from a respective single one of the electrodes.

The apparatus may further comprise a beam splitter for splitting the laser beam, such that synchronised series of laser pulses are provided to each of the optical sensors.

The laser source, the beam splitter and the optical sensors may be arranged so that in operation laser pulses arrive substantially simultaneously at each of the optical sensors.

The electron bunch or other group of charged particles may be one of a sequence of electron bunches or other groups of charged particles, the sequence of electron bunches or other groups of charged particles may comprise electron bunches or other groups of charged particles each having one of a plurality of different energies.

The sequence of electron bunches or other groups of charged particles may comprise a sequence of electron bunches or other groups of charged particles of a radiation source, and a controller may be configured to alter an operating parameter of the radiation source for electron bunches or other groups of charged particles having a selected one of the plurality of energies.

The controller may be configured to monitor at least one of the first measurement signal, the second measurement signal, and/or a parameter derived from the first measurement signal and/or the second measurement signal, thereby to identify whether the electron bunch or other group of charged particles whose lateral position and/or charge is determined is an electron bunch or other group of charged particles of the selected energy. The operating parameter may comprise a timing parameter.

Energies of electron bunches or other groups of charged particles of the sequence may be in a range 100 MeV to 1000 MeV.

The processing resource may be configured to determine said at least one property for a succession of electron bunches or other groups of charged particles and to monitor for a change in a value of said property.

In a further aspect of the invention, which may be provided independently, there is provided a method of measuring at least one property of an electron bunch or other group of charged particles travelling through a cavity, comprising: obtaining signals from a plurality of electrodes arranged around the cavity; providing the signals to a plurality of optical sensors, thereby to modulate at least one optical property of the optical sensors; obtaining measurements representative of said at least one optical property of the optical sensors; and processing at least a first measurement signal from a first one of the optical sensors and a second measurement signal from a second one of the optical sensors, thereby to determine at least one property of the electron bunch or other group of charged particles, wherein the at least one property comprises: charge and/or lateral position.

In another aspect of the invention, which may be provided independently, there is provided a radiation source comprising: an electron source for generating bunches of electrons; at least one linear accelerator (LINAC) for accelerating and decelerating the bunches of electrons; an undulator configured such that in operation passage of the bunches of electrons through the undulator generates radiation at a desired wavelength; a plurality of steering units for guiding the bunches of electrons along a desired electron bunch path between the electron source, the at least one LINAC and the undulator; and a measurement apparatus as claimed or described herein arranged to measure at least one property of an electron bunch in the radiation source.

In another aspect of the invention, which may be provided independently, there is provided a lithographic system comprising a radiation source as claimed or described herein, and a lithographic apparatus arranged to receive radiation from the radiation source and to use the radiation to project a pattern from a patterning device onto a substrate.

Aspects and/or features of the invention set out above or below may be combined with other aspects and/or features of the invention as will be readily apparent to the skilled person.

BRIEF DESCRIPTION OF THE DRAWINGS

Embodiments of the invention will now be described, by way of example only, with reference to the accompanying schematic drawings, in which.

DETAILED DESCRIPTION

Figure 1:
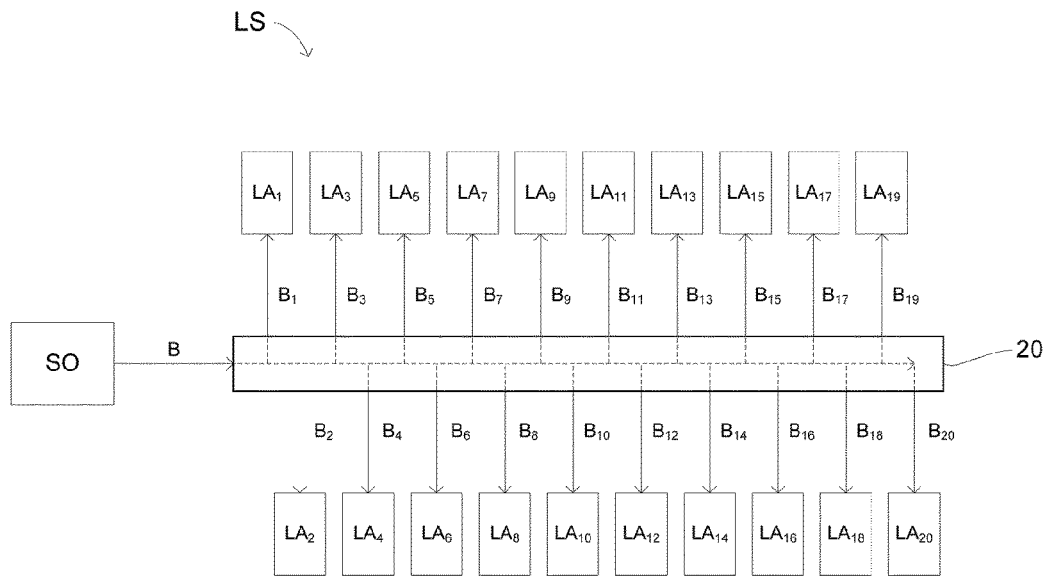
FIG. 1 is a schematic illustration of a lithographic system comprising a radiation source and a plurality of lithographic apparatus.

FIG. 1 shows a lithographic system LS, comprising: a radiation source SO, a beam splitting apparatus 20 and a plurality of lithographic apparatus $LA_1$-$LA_{20}$. The radiation source SO comprises at least one free electron laser and is configured to generate an extreme ultraviolet (EUV) radiation beam B (which may be referred to as a main beam). The main radiation beam B is split into a plurality of radiation beams $B_1$-$B_{20}$ (which may be referred to as branch beams), each of which is directed to a different one of the lithographic apparatus $LA_1$-$LA_{20}$, by the beam splitting apparatus 20. The branch radiation beams $B_1$-$B_{20}$ may be split off from the main radiation beam B in series, with each branch radiation beam being split off from the main radiation beam B downstream from the preceding branch radiation beam. The beam splitting apparatus may, for example, comprise a series of mirrors (not shown) which are each configured to split off a portion of the main radiation beam B into a branch radiation beam $B_1$-$B_{20}$.

The branch radiation beams $B_1$-$B_{20}$ are depicted in FIG. 1 as being split off from the main radiation beam B such that the branch radiation beams $B_1$-$B_{20}$ propagate in directions which are approximately perpendicular to the direction of propagation of the main radiation beam B. However, in some embodiments the branch radiation beams $B_1$-$B_{20}$ may instead be split off from the main radiation beam B such that an angle between the direction of propagation of each branch radiation beam $B_1$-$B_{20}$ and the direction of propagation of the main radiation beam is substantially less than 90 degrees. This may allow mirrors of the beam splitting apparatus to be arranged such that the main radiation beam B is incident on the mirrors at an angle of incidence which is less than normal. This may advantageously decrease the amount of radiation which is absorbed by the mirrors and therefore increase the amount of radiation which is reflected from the mirrors and which is provided to the lithographic apparatus $LA_1$-$LA_{20}$ via the branch radiation beams $B_1$-$B_{20}$.

The lithographic apparatus $LA_1$-$LA_{20}$ may all be positioned on the same vertical level. The vertical level on which the lithographic apparatus $LA_1$-$LA_{20}$ are positioned may be substantially the same vertical level as the vertical level on which the beam splitting apparatus 20 is positioned and on which the main beam B is received from the radiation source SO. Alternatively, the beam splitting apparatus 20 may direct at least some of the branch radiation beams $B_1$-$B_{20}$ to one or more different vertical levels on which at least some of the lithographic apparatus $LA_1$-$LA_{20}$ are positioned. For example, the main radiation beam B may be received by the beam splitting apparatus on a basement or ground floor vertical level. The beam splitting apparatus 20 may direct at least some branch radiation beams $B_1$-$B_{20}$ to a vertical level which is positioned above the beam splitting apparatus and on which at least some of the lithographic apparatus $LA_1$-$LA_{20}$ are positioned. The lithographic apparatus $LA_1$-$LA_{20}$ may be positioned on multiple vertical levels and as such the beam splitting apparatus 20 may direct the branch radiation beams $B_1$-$B_{20}$ to different vertical levels in order to be received by the lithographic apparatus $LA_1$-$LA_{20}$.

The radiation source SO, beam splitting apparatus 20 and lithographic apparatus $LA_1$-$LA_{20}$ may all be constructed and arranged such that they can be isolated from the external environment. A vacuum may be provided in at least part of the radiation source SO, beam splitting apparatus 20 and lithographic apparatus $LA_1$-$LA_{20}$ so as to minimise the absorption of EUV radiation. Different parts of the lithographic system LS may be provided with vacuums at different pressures (i.e. held at different pressures which are below atmospheric pressure).

Figure 2:
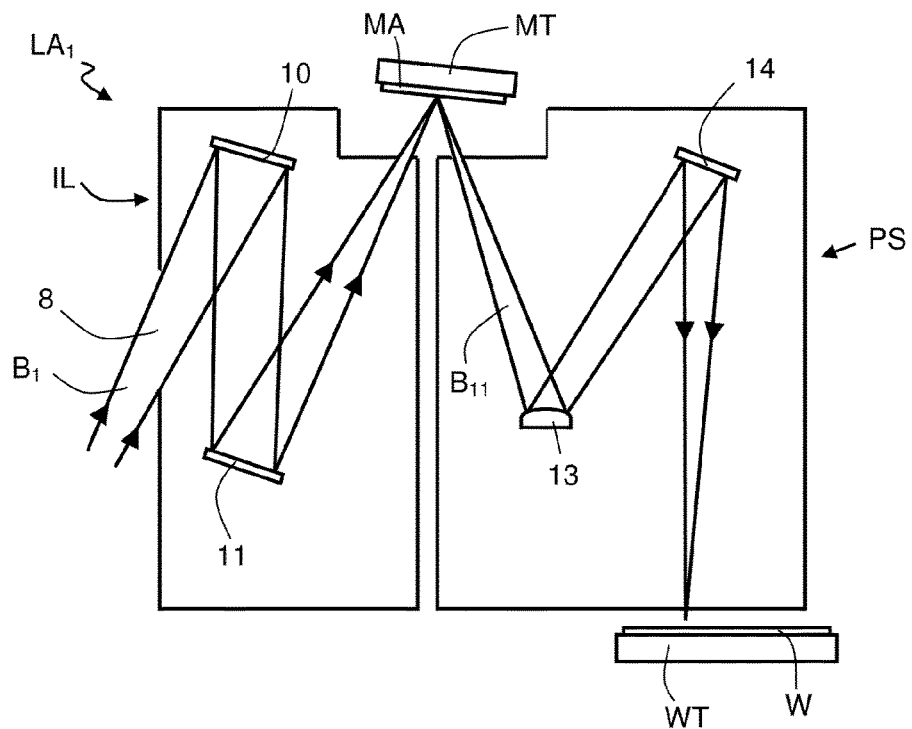
FIG. 2 is a schematic illustration of a lithographic apparatus that forms part of the lithographic system of FIG. 1.

FIG. 2 is a schematic depiction of a lithographic apparatus $LA_1$ of the lithographic system LS shown in FIG. 1. The lithographic apparatus $LA_1$ comprises an illumination system IL, a support structure MT configured to support a patterning device MA (e.g. a mask), a projection system PS and a substrate table WT configured to support a substrate W. The illumination system IL is configured to condition the branch radiation beam $B_1$ that is received by the lithographic apparatus $LA_1$ before it is incident upon the patterning device MA. The projection system PS is configured to project the branch radiation beam $B_1$ (now patterned by the mask MA) onto the substrate W. The substrate W may include previously formed patterns. Where this is the case, the lithographic apparatus aligns the patterned radiation beam $B_1$ with a pattern previously formed on the substrate W.

The branch radiation beam $B_1$ that is received by the lithographic apparatus $LA_1$ passes into the illumination system IL from the beam splitting apparatus 20 through an opening 8 in an enclosing structure of the illumination system IL. Optionally, the branch radiation beam $B_1$ may be focused to form an intermediate focus at or near to the opening 8.

The illumination system IL may include a facetted field mirror device 10 and a facetted pupil mirror device 11. The faceted field mirror device 10 and faceted pupil mirror device 11 together provide the radiation beam $B_1$ with a desired cross-sectional shape and a desired angular distribution. The radiation beam $B_1$ passes from the illumination system IL and is incident upon the patterning device MA held by the support structure MT. The patterning device MA reflects and patterns the radiation beam to form a patterned beam $B_{11}$. The illumination system IL may include other mirrors or devices in addition to or instead of the faceted field mirror device 10 and faceted pupil mirror device 11. The illumination system IL may for example include an array of independently moveable mirrors. The independently moveable mirrors may for example measure less than 1 mm across. The independently moveable mirrors may for example be MEMS devices.

Following reflection from the patterning device MA the patterned radiation beam $B_{11}$ enters the projection system PS. The projection system comprises a plurality of mirrors 13, 14 which are configured to project the radiation beam $B_{11}$ onto a substrate W held by the substrate table WT. The projection system PS may apply a reduction factor to the radiation beam, forming an image with features that are smaller than corresponding features on the patterning device MA. A reduction factor of 4 may for example be applied. Although the projection system PS has two mirrors 13, 14 in FIG. 2, the projection system may include any number of mirrors (e.g. six mirrors).

In some embodiments a lithographic system LS may include one or more mask inspection apparatus (not shown). A mask inspection apparatus may include optics (e.g. mirrors) configured to receive a branch radiation beam $B_1$-$B_{20}$ from the beam splitting apparatus 20 and direct the branch radiation beam at a mask MA. The mask inspection apparatus may further include optics (e.g. mirrors) configured to collect radiation reflected from the mask and form an image of the mask at an imaging sensor. The image received at the imaging sensor may be used to determine one or more properties of the mask MA. The mask inspection apparatus may, for example, be similar to the lithographic apparatus LA1 shown in FIG. 2, with the substrate table WT replaced with an imaging sensor.

In some embodiments a lithographic system LS may include one or more Aerial Image Measurement System (AIMS) which may be used to measure one or more properties of a mask MA. An AIMS may, for example, be configured to receive a branch radiation beam $B_1$-$B_{20}$ from the beam splitting apparatus 20 and use the branch radiation beam $B_1$-$B_{20}$ to determine one or more properties of a mask MA.

The radiation source SO comprises a free electron laser FEL which is operable to produce a beam of EUV radiation. Optionally, the radiation source SO may comprise more than one free electron laser FEL.

A free electron laser comprises an electron source, which is operable to produce a bunched relativistic electron beam, and a periodic magnetic field through which the bunches of relativistic electrons are directed. The periodic magnetic field is produced by an undulator and causes the electrons to follow an oscillating path about a central axis. As a result of the acceleration caused by the magnetic fields the electrons spontaneously radiate electromagnetic radiation generally in the direction of the central axis. The relativistic electrons interact with radiation within the undulator. Under certain conditions, this interaction causes the electrons to bunch together into microbunches, modulated at the wavelength of radiation within the undulator, and coherent emission of radiation along the central axis is stimulated.

Figure 3:
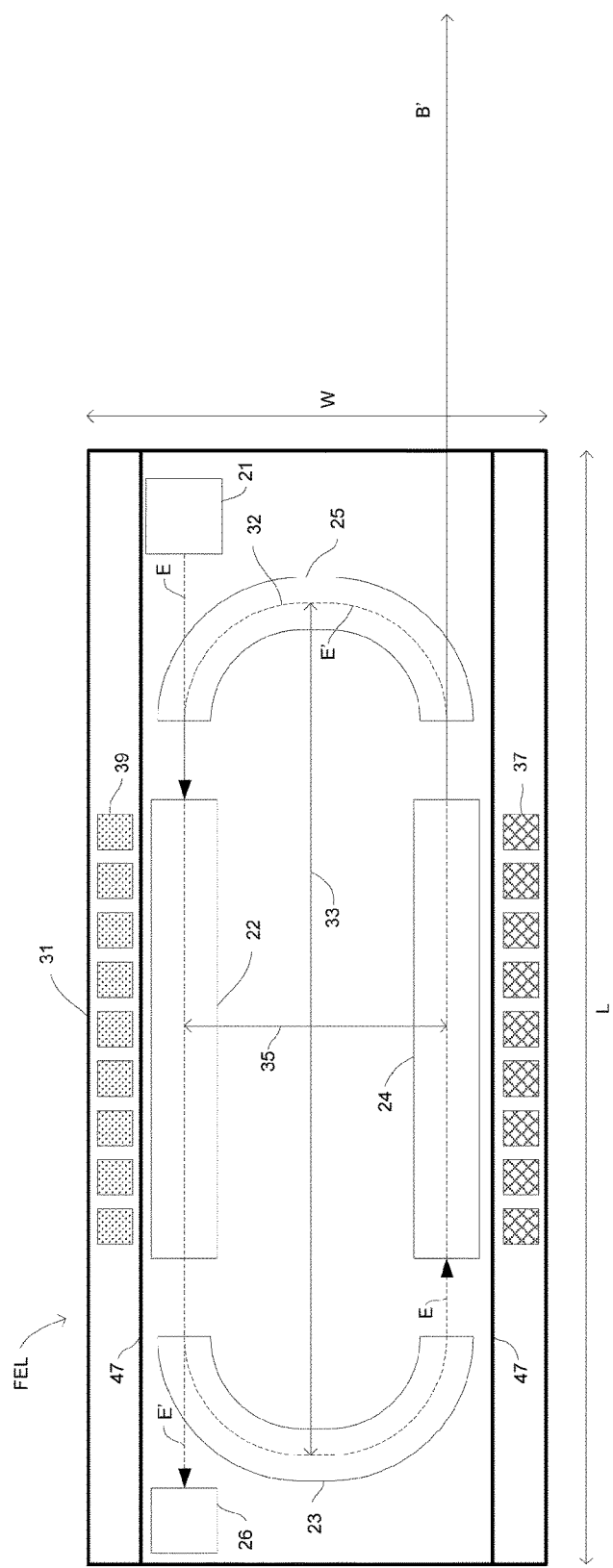
FIG. 3 is a schematic illustration of a free electron laser.

FIG. 3 is a schematic depiction of a free electron laser FEL comprising an electron source 21, a linear accelerator 22, a steering unit 23 and an undulator 24. The electron source 21 may alternatively be referred to as an injector.

The electron source 21 is operable to produce a beam of electrons E. The electron source 21 may, for example, comprise a photo-cathode or a thermionic cathode and an accelerating electric field. The electron beam E is a bunched electron beam E which comprises a series of bunches of electrons. The electron beam E is accelerated to relativistic energies by the linear accelerator 22. In an example, the linear accelerator 22 may comprise a plurality of radio frequency cavities, which are axially spaced along a common axis, and one or more radio frequency power sources, which are operable to control the electromagnetic fields along the common axis as bunches of electrons pass between them so as to accelerate each bunch of electrons. The cavities may be superconducting radio frequency cavities. Advantageously, this allows: relatively large electromagnetic fields to be applied at high duty cycles; larger beam apertures, resulting in fewer losses due to wakefields; and for the fraction of radio frequency energy that is transmitted to the beam (as opposed to dissipated through the cavity walls) to be increased. Alternatively, the cavities may be conventionally conducting (i.e. not superconducting), and may be formed from, for example, copper. Other types of linear accelerators may also be used. For example, the linear accelerator 22 may comprise a laser accelerator, wherein the electron beam E passes through a focused laser beam and the electric field of the laser beam causes the electrons to accelerate.

The relativistic electron beam E which exits the linear accelerator 22 enters the steering unit 23. The steering unit 23 is operable to alter the trajectory of the relativistic electron beam E so as to direct the electron beam E from the linear accelerator 22 to the undulator 24. The steering unit 23 may, for example, comprise one or more electromagnets and/or permanent magnets configured to generate a magnetic field in the steering unit 23. The magnetic field exerts a force on the electron beam E which acts to alter the trajectory of the electron beam E. The trajectory of the electron beam E upon leaving the linear accelerator 22 is altered by the steering unit 23 so as to direct the electrons to the undulator 24.

In embodiments in which the steering unit 23 comprises one or more electromagnets and/or permanent magnets, the magnets may be arranged to form one or more of a magnetic dipole, a magnetic quadrupole, a magnetic sextupole and/or any other kind of multipole magnetic field arrangement configured to apply a force to the electron beam E. The steering unit 23 may additionally or alternatively comprise one or more electrically charged plates, configured to create an electric field in the steering unit 23 such that a force is applied to the electron beam E. In general the steering unit 23 may comprise any apparatus which is operable to apply a force to the electron beam E to alter its trajectory.

The steering unit 23 directs the relativistic electron beam E to the undulator 24. The undulator 24 is operable to guide the relativistic electrons along a periodic path so that the electron beam E interacts with radiation within the undulator 24 so as to stimulate emission of coherent radiation. Generally the undulator 24 comprises a plurality of magnets, which are operable to produce a periodic magnetic field which causes the electron beam E to follow a periodic path. As a result the electrons emit electromagnetic radiation generally in the direction of a central axis of the undulator 24. The undulator 24 may comprise a plurality of sections (not shown), each section comprising a periodic magnet structure. The electromagnetic radiation may form bunches at the beginning of each undulator section. The undulator 24 may further comprise a mechanism for refocusing the electron beam E such as, for example, a quadrupole magnet in between one or more pairs of adjacent sections. The mechanism for refocusing the electron beam E may reduce the size of the electron bunches, which may improve the coupling between the electrons and the radiation within the undulator 24, increasing the stimulation of emission of radiation.

As electrons move through the undulator 24, they interact with the electric field of the electromagnetic radiation in the undulator 24, exchanging energy with the radiation. In general the amount of energy exchanged between the electrons and the radiation will oscillate rapidly unless conditions are close to a resonance condition, given by:

$$\lambda_{em} = \frac{\lambda_u}{2\gamma^2}\left(1 + \frac{K^2}{A}\right), \quad (1)$$

where $\lambda_{em}$ is the wavelength of the radiation, $\lambda_u$ is the undulator period, $\gamma$ is the Lorentz factor of the electrons and K is the undulator parameter. A is dependent upon the geometry of the undulator 24: for a helical undulator A=1, whereas for a planar undulator A=2. In practice, each bunch of electrons will have a spread of energies although this spread may be minimised as far as possible (by producing an electron beam E with low emittance). The undulator parameter K is typically approximately 1 and is given by:

$$K = \frac{q\lambda_u B_0}{2\pi mc}, \quad (2)$$

where q and m are, respectively, the electric charge and mass of the electrons, $B_0$ is the amplitude of the periodic magnetic field, and c is the speed of light.

The resonant wavelength $\lambda_{em}$ is equal to the first harmonic wavelength spontaneously radiated by electrons moving through the undulator 24. The free electron laser FEL may operate in self-amplified spontaneous emission (SASE) mode. Operation in SASE mode may require a low energy spread of the electron bunches in the electron beam E before it enters the undulator 24. Alternatively, the free electron laser FEL may comprise a seed radiation source, which may be amplified by stimulated emission within the undulator 24.

Electrons moving through the undulator 24 may cause the amplitude of radiation to increase, i.e. the free electron laser FEL may have a non-zero gain. Maximum gain may be achieved when the resonance condition is met or when conditions are close to but slightly off resonance.

An electron which meets the resonance condition as it enters the undulator 24 will lose (or gain) energy as it emits (or absorbs) radiation, so that the resonance condition is no longer satisfied. Therefore, in some embodiments the undulator 24 may be tapered. That is, the amplitude of the periodic magnetic field and/or the undulator period may vary along the length of the undulator 24 in order to keep bunches of electrons at or close to resonance as they are guided though the undulator 24. Note that the interaction between the electrons and radiation within the undulator 24 produces a spread of energies within the electron bunches. The tapering of the undulator 24 may be arranged to maximise the number of electrons at or close to resonance. For example, the electron bunches may have an energy distribution which peaks at a peak energy and the tapering maybe arranged to keep electrons with this peak energy at or close to resonance as they are guided though the undulator 24. Advantageously, tapering of the undulator has the capacity to significantly increase conversion efficiency. The use of a tapered undulator may increase the conversion efficiency (i.e. the portion of the energy of the electron beam E which is converted to radiation in the radiation beam B) by more than a factor of 2. The tapering of the undulator may be achieved by reducing the undulator parameter K along its length. This may be achieved by matching the undulator period and/or the magnetic field strength $B_0$ along the axis of the undulator and/or a parameter (often denoted A)

defining polarisation of produced radiation and defined by undulator geometry to the electron bunch energy to ensure that they are at or close to the resonance condition. Meeting the resonance condition in this manner increases the bandwidth of the emitted radiation.

After leaving the undulator 24, the electromagnetic radiation is emitted as a radiation beam B'. The radiation beam B' comprises EUV radiation and may form all or part of the radiation beam B which is provided to the beam splitting apparatus 20 (depicted in FIG. 1) and which forms the branch radiation beams $B_{1-20}$ which are provided to the lithographic apparatus $LA_{1-20}$.

In the embodiment of a free electron laser which is depicted in FIG. 3, the electron beam E' which leaves the undulator 24 enters a second steering unit 25. The second steering unit 25 alters the trajectory of the electron beam E' which leaves the undulator 24 so as to direct the electron beam E' back through the linear accelerator 22. The second steering unit 25 may be similar to the steering unit 23 and may, for example, comprise one or more electromagnets and/or permanent magnets. The second steering unit 25 does not affect the trajectory of the radiation beam B' which leaves the undulator 24. The steering unit 25 therefore decouples the trajectory of the electron beam E' from the radiation beam B'. In some embodiments, the trajectory of the electron beam E' may be decoupled from the trajectory of the radiation beam B' (e.g. using one or more magnets) before reaching the second steering unit 25.

The second steering unit 25 directs the electron beam E' to the linear accelerator 22 after leaving the undulator 24. Electron bunches which have passed through the undulator 24 may enter the linear accelerator 22 with a phase difference of approximately 180 degrees relative to accelerating fields in the linear accelerator 22 (e.g. radio frequency fields). The phase difference between the electron bunches and the accelerating fields in the linear accelerator 22 causes the electrons to be decelerated by the fields. The decelerating electrons E' pass some of their energy back to the fields in the linear accelerator 22 thereby increasing the strength of the fields which accelerate the electron beam E arriving from the electron source 21. This arrangement therefore recovers some of the energy which was given to electron bunches in the linear accelerator 22 (when they were accelerated by the linear accelerator) in order to accelerate subsequent electron bunches which arrive from the electron source 21. Such an arrangement may be known as an energy recovering LINAC.

Electrons E' which are decelerated by the linear accelerator 22 are absorbed by a beam dump 26. The steering unit 23 may be operable to decouple the trajectory of the electron beam E' which has been decelerated by the linear accelerator 22 from the trajectory of the electron beam E which has been accelerated by the linear accelerator 22. This may allow the decelerated electron beam E' to be absorbed by the beam dump 26 whilst the accelerated electron beam E is directed to the undulator 24.

Alternatively the free electron laser FEL may comprise a beam splitting unit (not shown) which is separate from the steering unit 23 and which is configured to decouple the trajectory of the accelerated electron beam E from the trajectory of the decelerated electron beam E' upstream of the steering unit 23.

Alternatively the trajectory of the accelerated electron beam E may be decoupled from the trajectory of the decelerated electron beam E' by generating a substantially constant magnetic field. The difference in energies between the accelerated electron beam E and the decelerated electron beam E' causes the trajectories of the two electron beams to be altered by different amounts by the constant magnetic field. The trajectories of the two electron beams will therefore become decoupled from each other.

The beam dump 26 may, for example, include a large amount of water or a material with a high threshold for radioactive isotope generation by high energy electron impact. For example, the beam dump 26 may include aluminium with a threshold for radioactive isotope generation of approximately 15 MeV. By decelerating the electron beam E' in the linear accelerator 22 before it is incident on the beam dump 26, the amount of energy the electrons have when they are absorbed by the beam dump 26 is reduced. This reduces the levels of induced radiation and secondary particles produced in the beam dump 26. This removes, or at least reduces, the need to remove and dispose of radioactive waste from the beam dump 26. This is advantageous since the removal of radioactive waste requires the free electron laser FEL to be shut down periodically and the disposal of radioactive waste can be costly and can have serious environmental implications.

When operating as a decelerator, the linear accelerator 22 may be operable to reduce the energy of the electrons E' to below a threshold energy. Electrons below this threshold energy may not induce any significant level of radioactivity in the beam dump 26.

In some embodiments a decelerator (not shown) which is separate to the linear accelerator 22 may be used to decelerate the electron beam E' which has passed through the undulator 24. The electron beam E' may be decelerated by the decelerator in addition to being decelerated by the linear accelerator 22 or instead of being decelerated by the linear accelerator 22. For example, the second steering unit 25 may direct the electron beam E' through a decelerator prior to the electron beam E' being decelerated by the linear accelerator 22. Additionally or alternatively the electron beam E' may pass through a decelerator after having been decelerated by the linear accelerator 22 and before being absorbed by the beam dump 26. Alternatively the electron beam E' may not pass through the linear accelerator 22 after leaving the undulator 24 and may be decelerated by one or more decelerators before being absorbed by the beam dump 26.

Optionally, the free electron laser FEL may comprise one or more bunch compressors (not shown). A bunch compressor may be disposed downstream or upstream of the linear accelerator 22. A bunch compressor is configured to bunch electrons in the electron beam E and spatially compress existing bunches of electrons in the electron beam E. One type of bunch compressor comprises an acceleration field directed parallel to the electron beam E. An electron in the electron beam E interacts with the provided field and bunches with other electrons nearby. The imposed energy difference for electrons in the bunch translates into a different propagation time to the non-relativistic case. Thus at a certain distance from such a bunch compressor the beam can be compressed longitudinally. Another type of bunch compressor comprises a magnetic chicane, wherein the length of a path followed by an electron as it passes through the chicane is dependent upon its energy. This type of bunch compressor may be used to compress a bunch of electrons which have been accelerated in a linear accelerator 22 by a plurality of conductors whose potentials oscillate at, for example, radio frequencies.

A gain length of the undulator defines a characteristic scale of light amplification. Gain length shortens with higher charge density in the bunch sent through the undulator. Thus it can be beneficial to compress the bunch radially and longitudinally. Simultaneously, bunch emittance degradation rate increases for a compressed bunch. That is, normalized emittance grows per meter of propagation in the beam line, and higher losses due to wakefields and coherent synchrotron radiation are associated with shorter bunches. Thus it can be most beneficial to place a bunch compressor between the steering unit 23 and the undulator 24.

The free electron laser FEL shown in FIG. 3 is housed within a building 31. The building 31 may comprise walls which do not substantially transmit radiation which is generated in the free electron laser FEL whilst the free electron laser FEL is in operation. For example, the building 31 may comprise thick concrete walls (e.g. walls which are approximately 4 meters thick). The walls of the building 31 may be further provided with radiation shielding materials such as, for example, lead and/or other materials which are configured to absorb neutrons and/or other radiation types. Providing walls of a building 31 with radiation absorbing materials may advantageously allow the thickness of the walls of the building 31 to be reduced. However adding radiation absorbing materials to a wall may increase the cost of constructing the building 31. A relatively cheap material which may be added to a wall of the building 31 in order to absorb radiation may, for example, be a layer of earth.

In addition to providing walls of the building 31 which have radiation shielding properties. The building 31 may also be configured to prevent radiation generated by the free electron laser FEL from contaminating ground water below the building 31. For example, the base and/or foundations of the building 31 may be provided with radiation shielding materials or may be sufficiently thick to prevent radiation from contaminating ground water below the building 31. In an embodiment the building 31 may be positioned at least partly underground. In such an embodiment ground water may surround portions of the exterior of the building 31 as well as being below the building 31. Radiation shielding may therefore be provided around the exterior of the building 31 in order to prevent radiation from contaminating ground water which surrounds the building 31.

In addition to or as an alternative to shielding radiation at the exterior of the building 31, radiation shielding may also be provided inside of the building 31. For example, radiation shielding may be provided inside the building 31 at locations proximate to portions of the free electron laser FEL which emit large amounts of radiation.

The building 31 has a width W and a length L. The width W and the length L of the building 31 is partly determined by the size of a loop 32 which the electron beam E follows through the free electron laser FEL. The loop 32 has a length 33 and a width 35.

The length 33 of the loop 32 is determined by the length of the linear accelerator 22 and the length of the undulator 24. A given length of linear accelerator 22 may, for example, be required in order to accelerate the electron beam E to high enough energies such that the electrons emit EUV radiation in the undulator 24. For example, a linear accelerator 22 may have a length of greater than about 40 meters. In some embodiments a linear accelerator 22 may have a length of up to about 80 meters. Additionally a given length of undulator 24 may be required in order to stimulate emission of coherent radiation in the undulator 24. For example, an undulator 24 may have a length of greater than about 40 m. In some embodiments an undulator 24 may have a length of up to about 60 meters.

The width of the loop is determined by the radius of curvature with which the steering unit 23 adjusts the trajectory of the electron beam E. The radius of curvature of the electron beam E in the steering unit 23 may depend, for example, on the velocity of the electrons in the electron beam E and on the strength of a magnetic field which is generated in the steering unit 23. An increase in the strength of a magnetic field which is generated in the steering unit 23 will decrease the radius of curvature of the electron beam E whereas an increase in the velocity of the electrons will increase the radius of curvature of the electron beam E. The radius of curvature of the electron beam E through the steering unit 23 may, for example, be approximately 12 m. In some embodiments the radius of curvature of the electron beam E through the steering unit 23 may be less than 12 m. For example, the radius of curvature of an electron beam E through the steering unit 23 may be approximately 7 m.

The loop 32 which the electron beam E follows through the free electron laser FEL may have a length 33 which is greater than about 60 meters. In some embodiments the loop 32 may have a length 33 which is up to about 120 meters. The loop 32 may have a width 35 which is greater than about 12 meters. In some embodiments the loop 32 may have a width 35 which is up to about 25 meters.

The building 31 may also house other components. For example, electrical cabinets 37 which contain electrical components which supply electrical power to, for example, the undulator 24, the steering units 23, 25 and/or other components of the free electron laser FEL may be housed within the building 31. It may be advantageous to provide the electrical cabinets 37 in close proximity to the undulator 24 as is shown in FIG. 3. However electrical cabinets 37 may be positioned in other positions relative to the components of the free electron laser FEL.

Additionally cryogenic cooling cabinets 39 which contain apparatus which is configured to provide cryogenic cooling to components of the free electron laser FEL may be housed within the building 31. Cryogenic cooling may, for example, be provided to the linear accelerator 22 and may cool superconducting cavities of the linear accelerator 22. It may be advantageous to provide the cryogenic cooling cabinets 39 in close proximity to the linear accelerator 22. This may reduce any energy loss between the cryogenic cooling cabinets 39 and the linear accelerator 22.

It may be desirable to provide electrical cabinets 37 and cryogenic cooling cabinets 39 on the outside of the loop 32 which the electron beam E follows through the free electron laser FEL (as is shown in FIG. 3). Providing the cabinets 37, 39 on the outside of the loop 32 may allow easy access to the cabinets, for example, to monitor, control, maintain and/or repair components which are housed within the cabinets 37, 39. As will be appreciated from FIG. 3, positioning the cabinets 37, 39 on the outside of the loop 32 may increase the minimum width W of the building 31 which is required to house the components of the free electron laser FEL within the building 31. The building 31 may also house other components which are not shown in FIG. 3 which may also determine the dimensions of the building 31.

As is shown in FIG. 3, a wall 47 is positioned between the loop 32 which the electron beam follows through the free electron laser FEL and the electric cabinets 37. A wall 47 is also positioned between the loop 32 and the cryogenic cooling cabinets 39. The walls 47 may shield the electric cabinets 37 and the cryogenic cabinets 39 from radiation which is generated by the electron beam E in the free electron laser FEL. This protects the components in the cabinets 37, 39 from being damaged by radiation and may allow maintenance workers to access the cabinets 37, 39 whilst the free electron laser FEL is in operation without being exposed to dangerous levels of radiation.

In the embodiment depicted in FIG. 3 the cabinets 37, 39 are shown as being housed in the same building 31 as the loop 32 which the electron beam follows through the free electron laser FEL whilst being shielded from the loop 32 by the walls 47. The cryogenic cooling components which are housed within the cabinets 39 may generate vibrations which may be transferred to components of the free electron laser FEL and may adversely affect components of a free electron laser FEL which are sensitive to vibrations. In order to prevent vibrations which are generated by cryogenic cooling components from transferring to sensitive parts of the free electron laser, a portion of the building 31 in which the cryogenic cooling cabinets 39 are housed may be mechanically isolated from the portion of the building in which sensitive components are housed. For example, the cryogenic cooling cabinets 39 may be mechanically isolated from the linear accelerator 22, the steering unit 23 and the undulator 24. In order to provide mechanical isolation the portion of the building 31 in which the cryogenic cooling cabinets 39 are housed may, for example, have separate foundations to a portion of the building in which the linear accelerator 22, the steering unit 23 and the undulator 24 are housed.

Alternatively the cryogenic cooling cabinets 39 and/or the electrical cabinets 37 may be housed in one or more buildings which are separate from the building 31. This may ensure that the cabinets 37, 39 are shielded from radiation which is produced by the electron beam E and that sensitive components of the free electron laser FEL are mechanically isolated from the cryogenic cooling cabinets 39.

A lithographic system LS may comprise a single free electron laser FEL. The free electron laser FEL may supply an EUV radiation beam to a beam splitting apparatus 20 which provides branch radiation beams to a plurality of lithographic apparatus. The radiation source SO may comprise an optical system which includes dedicated optical components configured to direct a radiation beam B' output from a free electron laser FEL to a beam splitter 20 of a lithographic system LS. Since EUV radiation is generally well absorbed by all matter, reflective optical components are generally used (rather than transmissive components) so as to minimise losses. The dedicated optical components of the optical system may adapt the properties of the radiation beam produced by the free electron laser FEL so that it is suitable for acceptance by the illumination systems IL of the lithographic apparatus $LA_1$-$LA_{20}$ and/or a mask inspection apparatus.

Alternatively a radiation source SO may comprise a plurality of free electron lasers (e.g. two free electron lasers) which may each provide an EUV radiation beam to an optical system which also forms part of the radiation source SO. The optical system may receive a radiation beam from each of a plurality of free electron lasers and may combine the radiation beams into a composite radiation beam which is provided to a beam splitting apparatus 20 in order to provide branch radiation beams $B_1$-$B_{20}$ to lithographic apparatus $LA_1$-$LA_{20}$.

Figure 4:
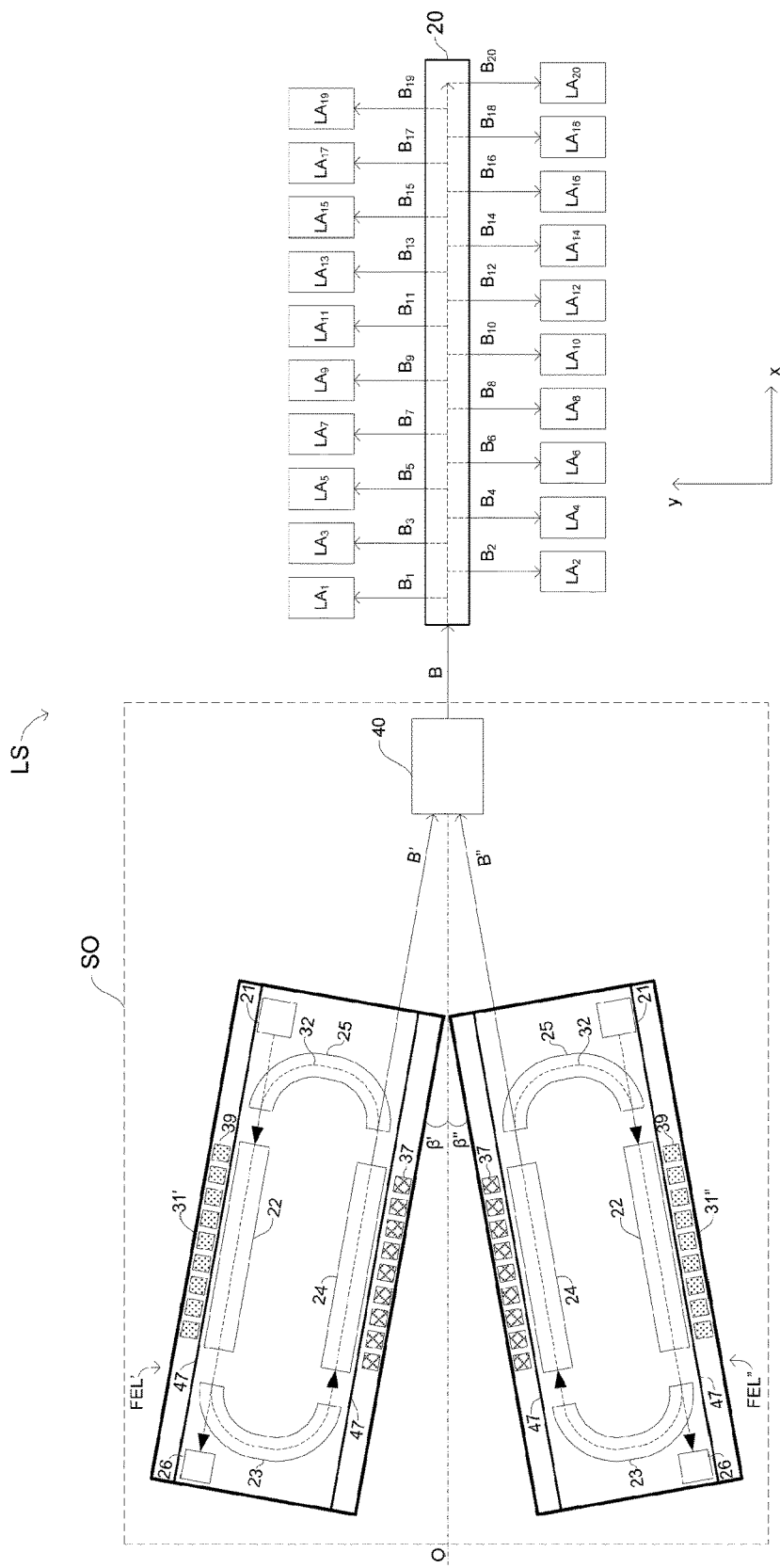
FIG. 4 is a schematic illustration of a lithographic system including a radiation source comprising two free electron lasers.

FIG. 4 is a schematic depiction of a lithographic system LS which includes a radiation source SO comprising a first free electron laser FEL' and a second free electron laser FEL". The first free electron laser FEL' outputs a first EUV radiation beam B' and the second free electron laser FEL" outputs a second EUV radiation beam B". The first free electron laser FEL' is housed within a first building 31'. The second free electron laser FEL" is housed within a second building 31".

The first and second radiation beams B', B" are received by an optical system 40. The optical system 40 comprises a plurality of optical elements (e.g. mirrors) which are arranged to receive the first radiation beam B' and the second radiation beam B" and output a main radiation beam B. At times at which both the first and second free electron lasers are operating, the main radiation beam B is a composite radiation beam which comprises radiation from both the first and second radiation beams B', B". The composite radiation beam B is provided to the beam splitting apparatus 20 which provides branch radiation beams $B_1$-$B_{20}$ to lithographic apparatus $LA_1$-$LA_{20}$.

The arrangement which is depicted in FIG. 4 in which two free electron lasers are arranged to provide radiation beams B', B" to form a main radiation beam B, may allow one of the free electron lasers to be turned off whilst radiation is continuously provided to the lithographic apparatus $LA_1$-$LA_{20}$. For example, one of the free electron lasers may be taken out of operation in order to, for example, allow the free electron laser to be repaired or to undergo maintenance. In this event the other free electron laser may continue to provide a radiation beam which is received by the optical system 40. In the event that only one of the free electron lasers provides radiation to the optical system 40, the optical system 40 is operable to form a main radiation beam B which comprises radiation from the free electron laser which is providing radiation to the optical system 40. This allows for continuous operation of the lithographic apparatus $LA_1$-$LA_{20}$ even when one of the free electron lasers is taken out of operation.

Figure 5:
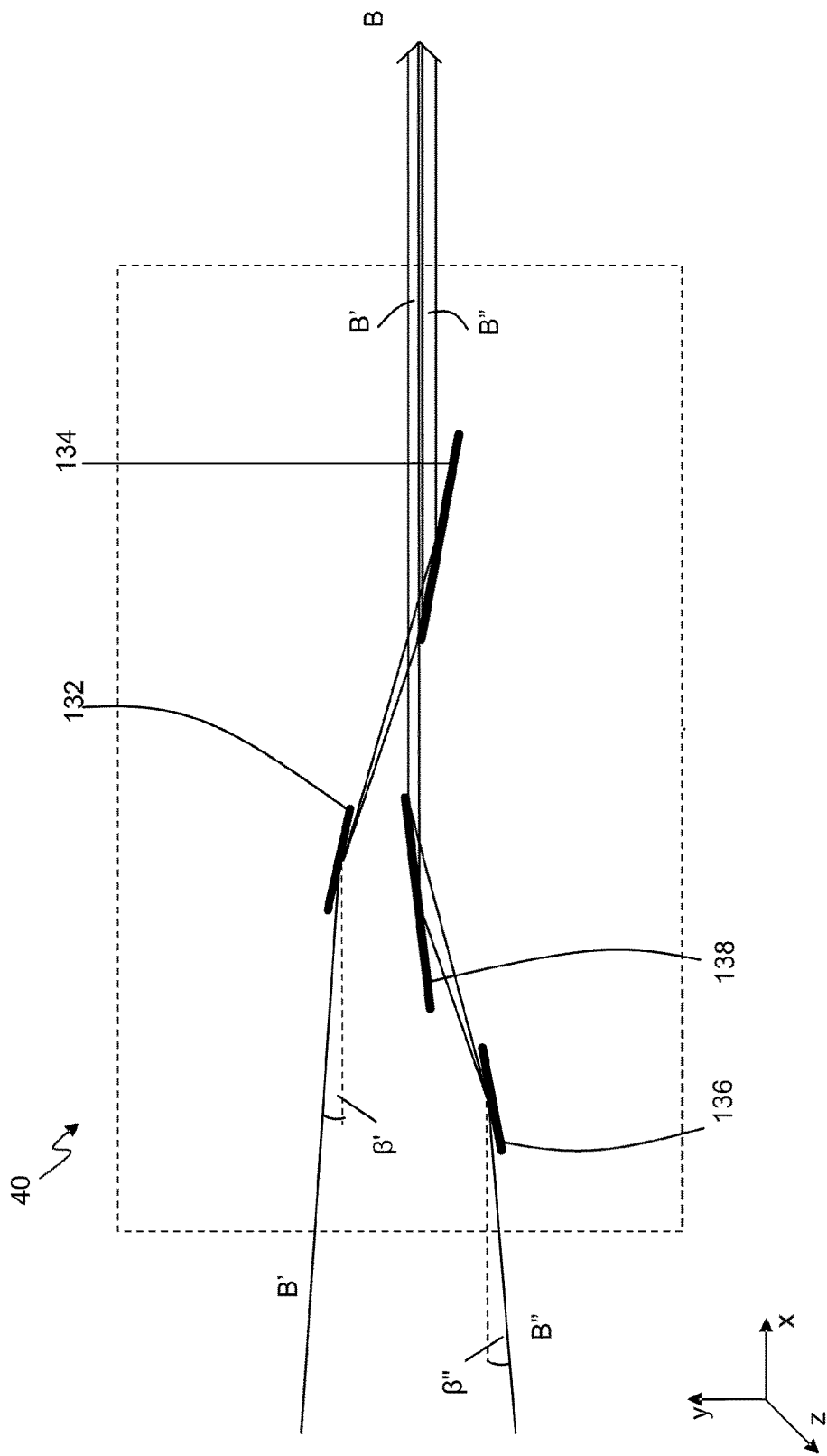
FIG. 5 is a schematic illustration of an optical system.

FIG. 5 is a schematic depiction of an embodiment of an optical system 40 according to an embodiment of the invention which is arranged to receive a beam of radiation B', B" from each of the free electron lasers FEL', FEL" and to output an output radiation beam B. The radiation beam B that is output by the optical system 40 is received by the beam splitting apparatus 20 (see FIG. 1).

The optical system 40 comprises four optical elements: first and second optical elements 132, 134 associated with a first one of the free electron lasers FEL'; and first and second optical elements 136, 138 associated with a second one of the free electron lasers FEL". The optical elements 132, 134, 136, 138 are arranged to alter the size and shape of the cross section of the radiation beams B', B" from the free electron lasers FEL', FEL".

In particular, the first optical elements 132, 136 are convex mirrors, which act to increase the cross sectional area of the radiation beams B', B" from the free electron lasers FEL', FEL". Although in FIG. 5 the first optical elements 132, 136 appear to be substantially flat in the x-y plane they may be convex both in this plane and in the z direction. Since the first optical elements 132, 136 are convex, they will increase the divergence of the EUV radiation beams B', B", thereby decreasing the heat load on mirrors downstream of them. The first optical element 132 is therefore a diverging optical element arranged to increase the cross sectional area of the radiation beam B' received from the first free electron laser FEL'. The first optical element 136 is a diverging optical element arranged to increase the cross sectional area of the radiation beam B" received from the second free electron laser FEL. This may allow mirrors downstream to be of a lower specification, with less cooling, and therefore less expensive. Additionally or alternatively, it may allow the downstream mirrors to be nearer to normal incidence. In practice, the radiation beam B output by the radiation source SO may be split by a plurality of consecutive, static, knife edge mirrors arranged in series in the path of the beam B. Increasing the size of the beam B (by, for example, using convex mirrors as the first optical elements 132, 136) reduces the accuracy with which the mirrors must be located in the beam B path. Therefore, this allows for more accurate splitting of the output beam B by the splitting apparatus 20.

The second optical elements 134, 138 are concave and are complementary in shape to the first optical elements such that the beams leaving the second optical elements 134, 138 have substantially zero divergence. Therefore, downstream of the second optical elements 134, 138 the beams are substantially collimated. Again, although in FIG. 5 the second optical elements 134, 138 appear to be substantially flat in the x-y plane they are in fact concave both in this plane and in the z direction.

It may be preferable for the output beam B, which is received by the beam splitting apparatus 20, to have a different shape and/or intensity distribution to that output by the free electron lasers FEL', FEL". For example, a rectangular shape may be preferable to a circular beam for consecutive knife edge extraction mirrors within the beam splitting apparatus 20. Therefore, in addition to increasing the cross sectional area of the radiation beams B', B", the optical elements 132, 134, 136, 138 may act to alter the cross sectional shape of the radiation beams B', B". In particular, the optical elements 132, 134, 136, 138 may be astigmatic or aspherical and may be shaped so as to ensure that the radiation beams B', B" leaving the second optical elements 134, 138 are more rectangular in shape than the radiation beams B', B" produced by the free electron lasers FEL', FEL". For example, the optical elements may be shaped so that the beams B', B" leaving the second optical elements 134, 138 are generally rectangular but with rounded corners, although other shapes are also possible. The two dimensions of such a rectangular shape may be related to radii of curvature of the optical elements in two perpendicular directions such as, for example, in the x-y plane and in the z direction. Advantageously, this allows the mirrors that are used to split the output radiation beam B into branch radiation beams $B_1$-$B_{20}$ (see FIG. 1) before they enter the lithographic apparatuses $LA_1$-$LA_{20}$, to be identical or at least very similar. This is especially beneficial from a manufacturing point of view.

When both of the free electron lasers FEL', FEL" are on, the optical system 40 is operable to combine their radiation beams B', B" to form a composite radiation beam B. In this embodiment, this is achieved by offsetting the first and second optical elements 132, 134 of the first free electron laser FEL' from those 136, 138 of the second free electron laser FEL" in the x-direction so that the beams B', B" leaving the second optical elements 134, 138 are both adjacent to each other and mutually parallel. In particular, the first and second optical elements 132, 134 of the first free electron laser FEL' are disposed "downstream" (with respect to the direction of propagation of the laser beams B', B") of those 136, 138 of the second free electron laser FEL".

In such an arrangement, the optical system 40 is operable to combine the two radiation beams B', B" to form a composite radiation beam. The composite beam is the output radiation beam B output by the optical system 40. It will be appreciated that FIG. 5 is merely exemplary and that the optical system 40 may be implemented other than as shown in FIG. 5.

Referring again to FIG. 4, the buildings 31', 31" are configured to substantially prevent radiation (other than the radiation beams B', B") which is generated by an operating free electron laser from propagating out of the buildings 31', 31". Housing the first and second free electron lasers inside separate buildings therefore allows maintenance and/or repair to be safely carried out on one of the free electron lasers whilst the other free electron laser continues to operate. For example, the first electron laser FEL' may be taken out of operation in order to allow the first free electron laser FEL' to be repaired or to undergo maintenance. During this time the second free electron laser FEL" may continue to operate in order to provide radiation to the optical system 40 and to the lithographic apparatus $LA_1$-$LA_{20}$. Radiation will therefore be generated in the second building 31" due to the operation of the second free electron laser FEL". Dangerous levels of radiation do not however leave the second building 31" and do not enter the first building 31' due to the radiation shielding which is provided by the walls of the second building 31". The first building may therefore be safely entered by maintenance workers in order to repair or carry out maintenance to the first free electron laser FEL'.

Figure 6:
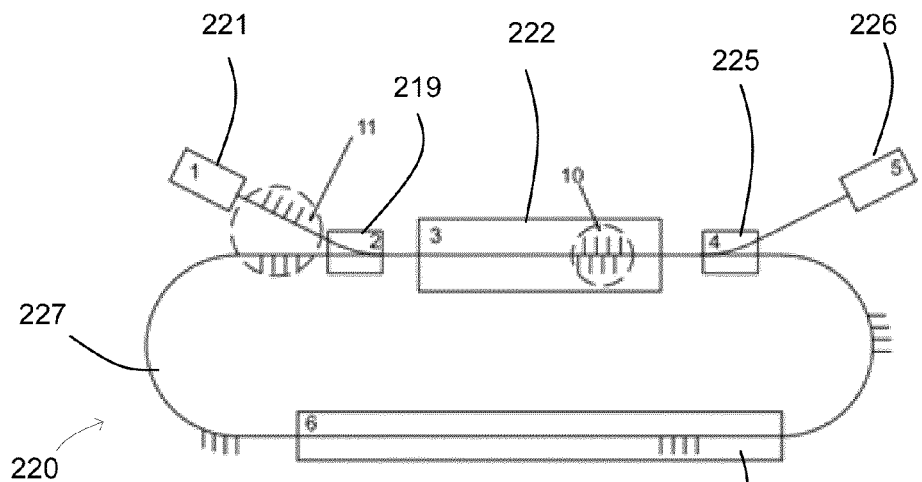
FIG. 6 is a schematic illustration of a further free-electron laser.

A further pass FEL radiation source is now described briefly with reference to FIG. 6. The single pass FEL radiation source of FIG. 6 is similar to that of FIG. 3, and includes an electron source in the form of injector 221, a merger component 219 for merging electron bunches from the injector 221 into an electron bunch stream, a LINAC 222 including a series of LINAC modules, an undulator 224, and a demerger component 225 for extracting decelerated electron bunches and directing them towards a beam dump 226. The radiation source also includes steering units, not shown in FIG. 6, that are operable to direct electron bunches along an electron bunch path 227 leading from the injector 221 through the LINAC 222, where they are accelerated, through the undulator 224, back through the LINAC 222, where they are decelerated, and then to the dump 226.

Each of the components of the single pass FEL radiation source 220 of FIG. 6 is similar or the same as a corresponding component of the radiation source of FIG. 3, and both radiation sources operate in a similar way.

In operation of the FEL radiation source 220, each electron bunch passes through the LINAC 222 once during an acceleration phase, and once during a deceleration phase, and hence the FEL radiation source may be referred to as a single pass FEL radiation source.

The acceleration phase of an electron bunch in this case may be considered to comprise the passage of the electron bunch from the entry to the LINAC 222 for the first time until the entry of the electron bunch into the undulator 224, even though it will be appreciated that the increase in energy of the electron bunch during the acceleration phase primarily occurs during passage of the electron bunch through the LINAC. The deceleration phase of an electron bunch in this case may be considered to comprise the passage of the electron bunch from the exit of the undulator 224 up to the exit of the electron bunch from the LINAC 222 for the last time, even though it will be appreciated that the decrease in energy of the electron bunch during the deceleration phase primarily occurs during passage of the electron bunch through the LINAC 222.

Figure 7:
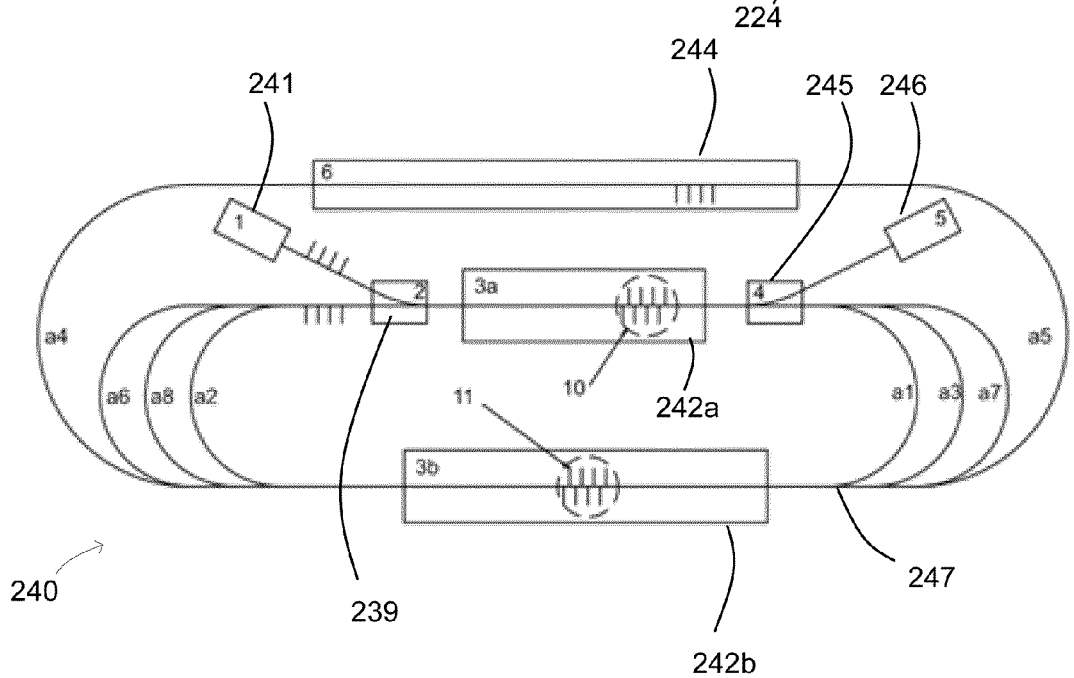
FIG. 7 is a schematic illustration of a free-electron laser radiation source including two energy-recover multi-pass LINACs.

Turning to a two-pass rather than a single-pass configuration, a two-pass FEL radiation source 240 according to an embodiment is illustrated schematically in FIG. 7.

The two pass, split acceleration FEL radiation source 240 of FIG. 7 includes an electron source in the form of injector 241, a merger component 239 for merging electron bunches from the injector 241 into an electron bunch stream, a pair of LINACs 242a, 242b each including a series of LINAC modules, an undulator 244, and a demerger component 245 for extracting decelerated electron bunches and directing them towards a beam dump 246. The radiation source also includes steering units, not shown in FIG. 6, that are operable to direct electron bunches along an electron bunch path 247.

Each of the components of the single pass FEL radiation source 240 of FIG. 7 is similar or the same as a corresponding component of the FEL radiation sources of FIG. 3 or 6. The radiation source 242 is configured to operate in such a way that, for each of the LINACs 242a, 242b accelerating and decelerating electron bunches pass through the LINAC closely spaced in time and 180 degrees out of phase relative to the r.f. fields such that energy is effectively exchanged between the accelerating and decelerating bunches and the LINAC operates as an energy recovery LINAC.

In operation of the FEL radiation source 240, each electron bunch passes through each of the LINACs 242a, 242b twice during an acceleration phase and twice during a deceleration phase, and hence the FEL radiation source may be referred to as a two-pass FEL radiation source.

The acceleration phase of an electron bunch in this case may be considered to comprise the passage of the electron bunch from the entry to the LINAC 242a for the first time until the entry of the electron bunch into the undulator 244, even though it will be appreciated that the increase in energy of the electron bunch during the acceleration phase primarily occurs during passage of the electron bunch through the LINACs 242a, 242b. The deceleration phase of an electron bunch in this case may be considered to comprise the passage of the electron bunch from the exit of the undulator 244 up to the exit of the electron bunch from the LINAC 244a for the last time, even though it will be appreciated that the decrease in energy of the electron bunch during the deceleration phase primarily occurs during passage of the electron bunch through the LINACs 242a, 242b.

An electron bunch path 247 is shown schematically in FIG. 7 and certain sequential points on the electron bunch path 247 for an electron bunch leaving the injector 241 are indicated by reference numerals $a1, a2, a3, a4, a5, a6, a7, a8$. An electron bunch passes between points $a1$ to $a8$, also passing through the LINACs 242a, 242b and the undulator 244, as can be understood by following the path 247 of FIG. 7 via points $a1$ to $a8$. The electron bunch path includes a number of loops such that each electron bunch passes through the LINACs more than once, as can be seen from FIG. 7. In operation, a repeating bunch train comprising successive electron bunches of different energies (for example, energies in a range 100 MeV to 1000 MeV) passes through the LINACs 242a, 242b.

In one embodiment the electron bunch repetition frequency may be around 1.5 GHz, but could have any other suitable value in other embodiments, for example in a range 100 MHz to 2 GHz. The electron bunches may, for example, have an electron bunch duration in a range 10 fs r.m.s. to 10 ps r.m.s (when measured at the electron source) but could have other suitable durations in alternative embodiments.

A measurement apparatus for measuring charge or position of electron bunches as they pass through a LINAC, for example LINAC 242b of the apparatus of FIG. 7, is now described. A pickup apparatus forming part of the measurement apparatus includes electrodes 302, 304, 306, 308 arranged around a cavity 310 through which the electron bunches pass in operation. The pickup apparatus also includes housings (not shown) for the electrodes and for electrical connections that are arranged to provide signals from the electrodes 302, 304, 306, 308 to electro-optic modulators 322, 324, 326, 328 comprising electro-optic crystals. The electro-optic modulators 322, 324, 326, 328 are Mach-Zender type electro-optic modulators, but any suitable type of electro-optic modulators can be used in alternative embodiments.

Figure 8:
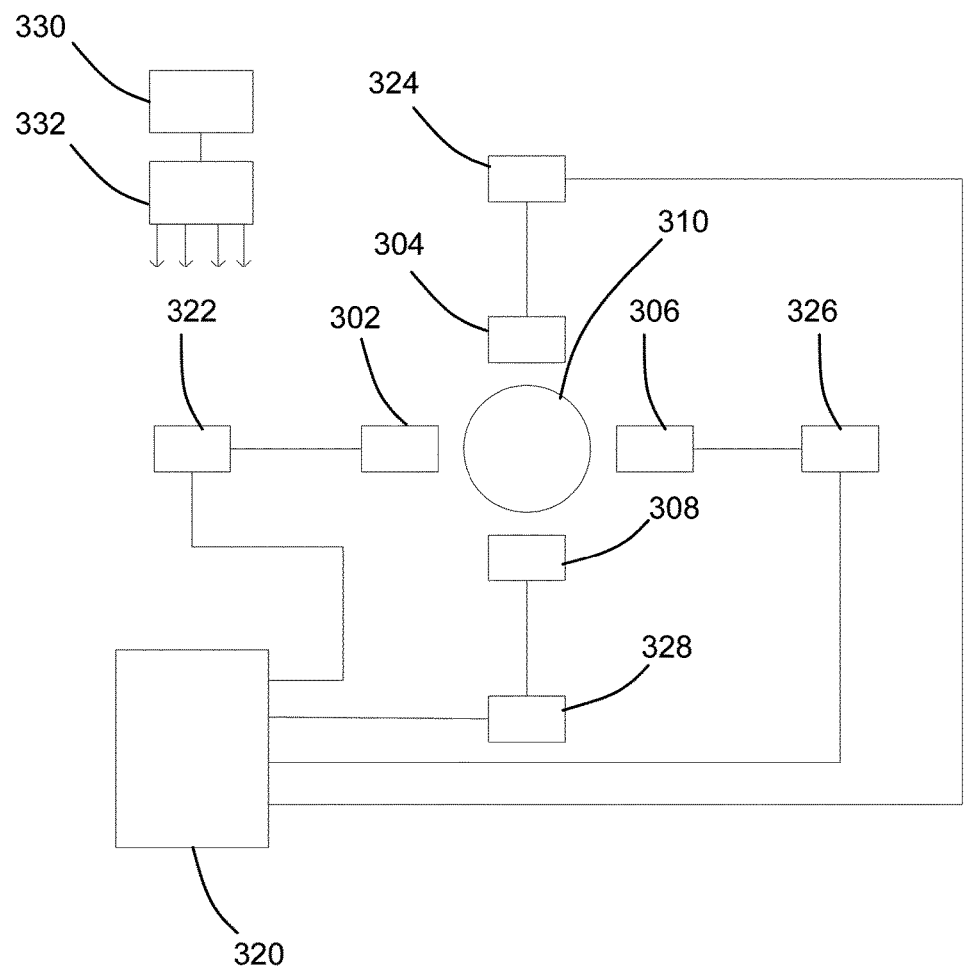
FIG. 8 is a schematic diagram of a measurement apparatus for measuring properties of electron bunches according to an embodiment.

The electro-optic modulators 322, 324, 326, 328 and electrodes 302, 304, 306, 308 are shown schematically in FIG. 8. The measurement apparatus also includes a femtosecond laser 330 that provides a femtosecond laser beam to a beam splitter 332 that splits the beam into four separate probe beams. Each probe beam is directed to a respective one of the electro-optic modulators 322, 324, 326, 328 by a respective fibre-optic waveguide (not shown, for clarity) or via any other suitable arrangement of optical components. A processing resource in the form of controller 320 is connected to the laser 330 and beam splitter 332 arrangement and monitors measurement signals from the electro-optic modulators 322, 324, 326, 328 that are obtained by modulation of the sampling laser beams due to their interaction with the electro-optic modulators 322, 324, 326, 328. The apparatus in the embodiment of FIG. 8 is arranged so that the pulses of each probe beam arrives at their respective electro-optic modulators 322, 324, 326, 328 simultaneously. In some embodiments, additional delay components (for example a precisely adjustable optical delay line) are used where necessary to ensure that the split beams arrive at the electro-optic modulators simultaneously. The use of four separate beams enables measurement of position in two directions (e.g. x and y directions). In some embodiments, where it is desired to measure position in only dimension, two beams rather than four beams are used.

The controller 320 in this case comprises dedicated control circuitry forming part of the measurement apparatus but in other embodiments the controller or other processing resource may comprise any suitable combination of software and hardware, for example software installed on a PC or other general purpose computer. In some embodiments the controller 320 or other processing resource comprises one or more ASICs or FPGAs.

The controller 320 is configured to process measurement signals from the electro-optic modulators thereby to determine at least one property of an electron bunch passing through the cavity between the electrodes 302, 304, 306, 308. The at least one property may comprise charge of the electron bunch and/or lateral position.

Considering first the determination of lateral position, in the embodiment of FIG. 8 the controller 320 receives respective measurement signals from each of electro-optic modulators 322, 324, 326, 328.

Each one of the electrodes 302, 304, 306, 308 has a respective separate electro-optic modulator 322, 324, 326, 328 to which it is connected. In operation each electro-optic modulator 322, 324, 326, 328 is probed by its respective split probe beam obtained from the femtosecond laser 330, and thus each is effectively probed at the same time by the same laser pulse from the femtosecond laser 330.

In the embodiment of FIG. 8 operation of the femtosecond laser 330 is synchronised with the passage of the electron bunches through the cavity such that each electro-optic modulator 322, 324, 326, 328 is probed by the laser pulse substantially at a maximum of the electro-optic modulator signal cycle, e.g. substantially at the moment when the passage of the electron bunch causes a maximum signal to be generated by each electro-optic modulator. A calibration procedure can be performed, for example by gradually varying the timing of the laser pulses, until measurement signals at the maximum point are obtained.

In a well calibrated set-up the difference of the maxima of the measurement signals obtained from electro-optic modulators connected to two opposing electrodes (for example, measurement signals obtained from electro-optic modulators 322, 326 connected to opposing electrodes 302, 306) is a measure of the lateral position in the cavity (e.g. in a beam pipe) of the electron bunch producing those measurement signals.

In the embodiment of FIG. 8, the controller 320 determines the difference between the measurement signals obtained in respect of electrodes 302, 306. That difference is representative of the lateral position of the electron bunch in the plane of the electrodes relative to a line between electrodes 302, 306. For example, in a suitably calibrated set-up if there is no difference in the measurement signals obtained in respect of electrodes 302, 306 that may indicate that the electron bunch is equidistant from electrodes 302, 306.

The controller 320 also determines the difference between measurement signals obtained from electro-optic modulators 324, 328 in respect of opposing electrodes 304, 308. That difference is representative of the lateral position of the electron bunch in the plane of the electrodes relative to a line between electrodes 304, 308.

By combining the two difference measurements, the controller 320 is able to determine the position of the electron bunch at the time of measurement in relation to the plane of the electrodes 302, 304, 306, 308. In this embodiment, the desired position of the electron bunch is at the centre of the plane of the electrodes 302, 304, 306, 308 and operating parameters of the radiation source may be adjusted in response to the position of the electron bunch being determined to be not at that centre point.

As well as or instead of determining the lateral position of the electron bunch, the controller 320 can also process the measurement signals from the electro-optic modulators 322, 324, 326, 328 to determine the charge of the electron bunch. In one mode of operation the controller 320 sums corresponding measurement signals from each of the electro-optic modulators 322, 324, 326, 328 to determine a parameter representative of the charge of the electron bunch.

The sum of the measurement signals can be taken as being dependent on both the total charge of the bunch and the longitudinal position of the bunch relative to the plane of electrodes 302, 304, 306, 308. However if the measurement apparatus has been set up initially (for example by suitably varying the timing of the laser pulses) to ensure that the measurement signals are maxima, it can be supposed that the electron bunches are at a longitudinal position substantially coincident with the plane of the electrodes 302, 304, 306, 308 at the time of the measurement, and thus the sum of the measurement signals can be taken as being representative of the total charge of the bunch. By way of further explanation, if one were to take an embodiment in which two sensors, sensor 1 and sensor 2 were opposed to each other in the same longitudinal plane, and measurement signal of amplitude A was obtained from sensor 1 and measurement signal of amplitude B was obtained simultaneously from sensor 2, then if the apparatus was calibrated such that A+B was equal to (or proportional to) total charge of the bunch, a lateral position of the bunch at the measurement time could be taken to be equal to (or proportional to) (A−B)/(A+B).

In one mode of operation, the controller 320 is configured to repeatedly obtain measurement signals that correspond to electron bunches of the same energy passing through the plane of electrodes 302, 304, 306, 308, for example by obtaining measurement signals at a repetition frequency that matches the desired or expected repetition frequency of the electron bunches. The controller 320 monitors the sum of the measurement signals and, if it is supposed that the charge of the bunches is constant, a variation in the sum of the measurement signals over time can be taken as indicating that the timing of the electron bunches is drifting away from the desired timing. For example, a reduction in the sum of the measurement signals can be taken as indicating that the electron bunch has either not yet arrived at the plane of the electrodes 302, 304, 306, 308, or has already passed through the plane of the electrodes 302, 304, 306, 308, at the moment of measurement.

Thus, given a constant charge, a drifting amplitude of the sum of the measurements in time may indicate a phase difference, corresponding to a variation in bunch time of arrival. Thus, the apparatus can be used for bunch time of arrival monitoring either alone or simultaneously with determination of charge and/or lateral position.

In the embodiment of FIG. 8, the electron bunch that is measured is one of a sequence of electron bunches passing through the LINAC. In the case where the apparatus is being used to measure electron bunches in LINAC 242*b* of the apparatus of FIG. 7, each successive bunch of the sequence has one of four different energies, and each bunch is either in an acceleration phase or deceleration phase and has arrived at the LINAC from one of the arcs corresponding to points a1, a3, a5 or a7.

In the embodiment of FIG. 8 it is not possible to determine from a single measurement the energy of the bunch, for example which of the four expected energies the bunch possesses in the case of measurements of electron bunches in LINAC 242*b* of the apparatus of FIG. 7. However, given a known repetition frequency of the laser pulses from a master clock and the phase from the first measurement, other bunches of the same energy can be measured as well. For example, by repeating measurements at an expected repetition frequency (or suitable fraction of that frequency) for electron bunches of a particular energy value it can be ensured that each of those measurements is of an electron bunch of the same energy (even if the particular energy is unknown).

In one mode of operation, the controller 320 alters at least one operating parameter of the radiation source in order to affect at least one property of electron bunches of a particular energy and then monitors the measurements obtained from the electro-optic modulators in order to determine whether the alteration of the at least one operating parameter has affected the measurements. If the alteration of the parameter does affect the measurements then it may be concluded, either automatically by the controller 320, or by an operator, that the electron bunch that is being measured using the electro-optic modulators is the one that has been affected by the alteration of the operating parameter(s).

The alteration of the operating parameter may comprise for example an adjustment of the setting of electron beam optics in one or more of the arcs corresponding to points a1, a3, a5 or a7 (or points a2, a4, a6 or a8). If an adjustment of the setting of electron beam optics for an arc that corresponds to a particular one of the electron bunch energies produces a significant alteration in the measurements obtained using the electro-optic modulators (for example a variation of amplitude of the measurements due to a variation in electron bunch timing) it may be concluded that it is electron bunches of that energy that are being measured.

Any suitable operating parameter may be altered, for example any suitable operating parameter that may affect the timing of passage of electron bunches of a particular energy through the LINAC. For instance, the operating parameter may comprise an operating parameter of bending magnets and/or combiners/spreaders is used to control the passage of electron bunches.

The controller 320 may alter the at least one operating parameter of the radiation source directly by sending one or more instructions directly to the relevant components of the radiation source, or by sending an instruction or request to a further controller that controls operation of the radiation source.

Operation of the apparatus of FIG. 8 is described in relation to measurement of electron bunches in the two-pass radiation source of FIG. 7. However, the embodiment of FIG. 8, and other embodiments, may also be used to measure electron bunches in other radiation sources, for example the single pass radiation sources of FIG. 3 or FIG. 6. Whilst the use of embodiments to measure electron bunches passing through LINACs of an FEL radiation source has been described, such embodiments may also be used to measure electron bunches in any other suitable circumstances, and embodiments are not limited to the measurement of electron bunches in LINACs or radiation sources.

Embodiments have been described in which electrodes are used to measure properties of electron bunches passing through the cavity between the electrodes. The electrodes may, for example, in some embodiments be located inside an electron beam propagation chamber, for example a beam pipe of a LINAC, or in other embodiments may be located outside the walls, or embedded in the walls, of such chamber.

Any suitable components, for example any suitable types of lasers, splitters, pick-up apparatus electrodes and electro-optic modulators, may be used in the measurement apparatus according to embodiments. For instance, in embodiments the lasers, splitters, pick-up apparatus electrodes and/or electro-optic modulators are of the same or similar type as those described in A. Angelovski et al, "High bandwidth pickup design for bunch arrival-time monitors for free electron laser", Physical Review Special Topics—Accelerators and Beams 15, 112803-1 to 112803-8 (2012) or M. K. Bock et al, "Recent Developments of the Bunch Arrival Time Monitor with Femtosecond Resolution at Flash", Proceedings of IPAC'10, Kyoto, Japan, WEOCMH02.

Embodiments may provide fast single/beam position measurements using electro-optic crystals probed with a femtosecond laser. Embodiments may provide fast single bunch charge measurements using electro-optic crystals probed with a femtosecond laser. Embodiments may provide simultaneous bunch position and bunch arrival time measurements using electro-optic crystals probed with a femtosecond laser.

Although embodiments have been described in relation to the determination of one or more properties of electron bunches, apparatus and methods according to alternative embodiments can be used to determine one or more properties (for example charge and/or lateral or other position) of other types of charged particles, for example groups of positrons, protons or ions. Furthermore, although embodiments have been described in relation to measurements in a LINAC of a radiation source, apparatus and methods according to alternative embodiments can be used to determine one or more properties of electron bunches or other groups of charged particles in any other suitable environment, system or arrangement. For example, embodiments could be used to determine properties of electron beams and positron beams (or other groups of charged particles) fired at a target.

Although embodiments have been described in relation to the determination of properties of successive electron bunches of a single bunch train, the apparatus and methods of embodiments can be used to perform measurements that can distinguish between overlapping bunch trains that have a phase difference between them. For example, by suitable selection of timing and frequency of operation of the laser pulses provided to the optical sensors, embodiments can be tuned to determine properties of electron bunches or other groups of charged particles that have a particular repetition frequency.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A measurement apparatus configured to measure a property of an electron bunch or other group of charged particles travelling through a cavity, comprising:
   electrodes arranged around the cavity;
   optical sensors, wherein the electrodes are configured to provide signals to the optical sensors thereby to modulate an optical property of the optical sensors;
   a laser source configured to provide a laser beam comprising a series of laser pulses to the optical sensors to obtain measurements representative of the optical property of the optical sensors; and
   a processing resource configured to process at least a first measurement signal from a first one of the optical sensors and a second measurement signal from a second one of the optical sensors, thereby to determine the property of the electron bunch or other group of charged particles, wherein the property comprises charge and/or lateral position.

2. The apparatus of claim 1, wherein:
   the optical sensors comprise electro-optic modulators,
   the first one of the optical sensors comprises a first one of the electro-optic modulators, and
   the second one of the optical sensors comprises a second one of the electro-optic modulators.

3. The apparatus of claim 1, wherein:
   the property comprises lateral position, and
   the processing of the first measurement signal, which is from the first one of the optical sensors, and the second measurement signal, which is from the second one of the optical sensors, comprises determining a difference between the first measurement signal and the second measurement signal.

4. The apparatus of claim 1, wherein the processing resource is configured to process a third measurement signal from a third one of the optical sensors and a fourth measurement signal from a fourth one of the optical sensors.

5. The apparatus of claim 4, wherein:
   the processing of the first measurement signal and the second measurement signal is to determine a position of the electron bunch or other group of charged particles in a first lateral direction, and
   the processing of the third measurement signal and the fourth measurement signal is to determine a position of the electron bunch or other group of charged particles in a second lateral direction.

6. The apparatus of claim 5, wherein the second lateral direction is substantially orthogonal to the first lateral direction.

7. The apparatus of claim 4, wherein:
the property of the electron bunch or other group of charged particles comprises charge of the electron bunch or other group of charged particles, and
the processing resource is configured to determine the charge in dependence on a sum of measurement signals,
wherein the sum of measurement signals comprises or is representative of a sum of the first, second, third, or fourth measurement signals.

8. The apparatus of claim 4, wherein:
the third optical sensor from which the third measurement signal is obtained receives signals from a third one of the electrodes, and
the fourth optical sensor from which the fourth measurement signal is obtained receives signals from a fourth one of the electrodes.

9. The apparatus of claim 4, wherein the third one of the electrodes is substantially diametrically opposed to the fourth one of the electrodes with respect to the electron bunch path.

10. The apparatus of claim 1, wherein:
the property of the electron bunch or other group of charged particles comprises charge of the electron bunch or other group of charged particles, and
the processing resource is configured to determine the charge in dependence on a sum of measurement signals,
wherein the sum of measurement signals comprises or is representative of a sum of the first or second measurement signals.

11. The apparatus of claim 1, wherein:
the first optical sensor from which the first measurement signal is obtained receives signals from a first one of the electrodes, and
the second optical sensor from which the second measurement signal is obtained receives signals from a second one of the electrodes.

12. The apparatus of claim 1, wherein the first one of the electrodes is substantially diametrically opposed to the second one of the electrodes.

13. The apparatus of claim 1, wherein the laser source is configured to provide the series of laser pulses such that the first measurement signal comprises a local maximum signal for the first one of the optical sensors and the second measurement signal comprises a local maximum signal for the second one of the optical sensors.

14. The apparatus of claim 1, wherein the optical sensors and the electrodes are arranged such that in operation each one of the optical sensors receives signals from a respective single one of the electrodes.

15. The apparatus of claim 1, wherein the apparatus further comprises a beam splitter for splitting the laser beam, such that synchronized series of laser pulses are provided to each of the optical sensors.

16. The apparatus of claim 15, wherein the laser source, the beam splitter and the optical sensors are arranged so that in operation laser pulses arrive substantially simultaneously at each of the optical sensors.

17. The apparatus of claim 1, wherein:
the electron bunch or other group of charged particles is one of a sequence of electron bunches or other groups of charged particles, the sequence of electron bunches or other groups of charged particles comprising electron bunches or other groups of charged particles each having one of a plurality of different energies.

18. The apparatus according to claim 17, wherein:
the sequence of electron bunches or other groups of charged particles is a sequence of electron bunches or other groups of charged particles of a radiation source, and
a controller of the radiation source is configured to alter an operating parameter of the radiation source for electron bunches or other groups of charged particles having a selected one of the plurality of energies.

19. The apparatus according to claim 18, wherein energies of electron bunches of the sequence are in a range 100 MeV to 1000 MeV.

20. The apparatus according to claim 18, wherein:
the controller is configured to monitor the first measurement signal, the second measurement signal, and/or a parameter derived from the first measurement signal and/or the second measurement signal,
thereby to identify whether the electron bunch or other group of charged particles whose lateral position and/or charge is determined is an electron bunch or other group of charged particles of the selected energy.

21. The apparatus of claim 1, wherein the processing resource is configured to determine the property for a succession of electron bunches and to monitor for a change in a value of the property.

22. A method of measuring a property of an electron bunch or other group of charged particles travelling through a cavity, comprising:
obtaining signals from a plurality of electrodes arranged around the cavity;
providing the signals to optical sensors, thereby to modulate an optical property of the optical sensors;
obtaining measurements representative of the optical property of the optical sensors; and
processing at least a first measurement signal from a first one of the optical sensors and a second measurement signal from a second one of the optical sensors to determine the property of the electron bunch or other group of charged particles, wherein the property comprises charge and/or lateral position.

23. A radiation source comprising:
an electron source configured to generate bunches of electrons;
a linear accelerator (LINAC) configured to accelerate and decelerate the bunches of electrons;
an undulator configured such that in operation passage of the bunches of electrons through the undulator generates radiation at a desired wavelength;
steering units configured to guide the bunches of electrons along a desired electron bunch path between the electron source, the LINAC and the undulator; and
a measurement apparatus configured to measure a property of the bunch of electrons travelling through a cavity to measure at least one property of the bunch of electrons in the radiation source, the measuring apparatus comprising:
electrodes arranged around the cavity;
optical sensors,
wherein the plurality of electrodes are configured to provide signals to the optical sensors thereby to modulate an optical property of the optical sensors;
a laser source configured to provide a laser beam comprising a series of laser pulses to the optical sensors to obtain measurements representative of the optical property of the optical sensors; and
a processing resource configured to process at least a first measurement signal from a first one of the optical sensors and a second measurement signal from a second one of the optical sensors to determine at least one property of the electron bunch or other group of charged particles, wherein the at least one property comprises charge and/or lateral position.

24. A lithographic system comprising:
a radiation source comprising:
   an electron source configured to generate bunches of electrons;
   a linear accelerator (LINAC) configured to accelerate and decelerate the bunches of electrons;
   an undulator configured such that in operation passage of the bunches of electrons through the undulator generates radiation at a desired wavelength;
   steering units configured to guide the bunches of electrons along a desired electron bunch path between the electron source, the LINAC and the undulator; and
   a measurement apparatus configured to measure a property of the bunch of electrons travelling through a cavity to measure at least one property of the bunch of electrons in the radiation source, the measuring apparatus comprising:
      electrodes arranged around the cavity;
      optical sensors,
         wherein the plurality of electrodes are configured to provide signals to the optical sensors thereby to modulate an optical property of the optical sensors;
      a laser source configured to provide a laser beam comprising a series of laser pulses to the optical sensors to obtain measurements representative of the optical property of the optical sensors; and
      a processing resource configured to process at least a first measurement signal from a first one of the optical sensors and a second measurement signal from a second one of the optical sensors to determine at least one property of the electron bunch or other group of charged particles, wherein the at least one property comprises charge and/or lateral position;
   a patterning device configured to patterned a radiation beam from the radiation source; and
   a projection system configure project the patterned beam onto a substrate.

* * * * *